(12) United States Patent
Maida et al.

(10) Patent No.: US 9,746,773 B2
(45) Date of Patent: Aug. 29, 2017

(54) TITANIA-DOPED QUARTZ GLASS AND MAKING METHOD

(71) Applicant: SHIN-ETSU CHEMICAL CO., LTD., Tokyo (JP)

(72) Inventors: Shigeru Maida, Joetsu (JP); Hisatoshi Otsuka, Joetsu (JP); Tetsuji Ueda, Koriyama (JP); Masanobu Ezaki, Koriyama (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 66 days.

(21) Appl. No.: 13/920,628

(22) Filed: Jun. 18, 2013

(65) Prior Publication Data

US 2013/0283858 A1   Oct. 31, 2013

Related U.S. Application Data

(62) Division of application No. 12/967,175, filed on Dec. 14, 2010, now abandoned.

(30) Foreign Application Priority Data

Dec. 25, 2009   (JP) .................................. 2009-294557

(51) Int. Cl.
*C03B 19/14* (2006.01)
*G03F 7/20* (2006.01)
(Continued)

(52) U.S. Cl.
CPC ............ *G03F 7/2008* (2013.01); *B82Y 10/00* (2013.01); *B82Y 40/00* (2013.01); *C03B 19/1423* (2013.01); *C03B 19/1453* (2013.01); *C03C 3/06* (2013.01); *G03F 1/24* (2013.01); *C03B 2201/21* (2013.01); *C03B 2201/23* (2013.01);
(Continued)

(58) Field of Classification Search
CPC ............ C03B 19/1423; C03B 19/1453; C03B 2201/21; C03B 2201/23; C03B 2201/42; C03B 2207/06; C03B 2207/12; C03B 2207/36
See application file for complete search history.

(56) References Cited

U.S. PATENT DOCUMENTS

| 4,414,012 A | 11/1983 | Suto et al. |
| 6,209,354 B1 | 4/2001 | Fujinoki et al. |

(Continued)

FOREIGN PATENT DOCUMENTS

| EP | 1795506 A1 | 6/2007 |
| EP | 2145865 A1 | 1/2010 |

(Continued)

OTHER PUBLICATIONS

Extended European Search Report dated Nov. 20, 2013, issued in corresponding European Patent Application 12162447.2 (5 pages).

(Continued)

*Primary Examiner* — Queenie Dehghan
(74) *Attorney, Agent, or Firm* — Westerman, Hattori, Daniels & Adrian, LLP

(57) ABSTRACT

Methods for selecting titania-doped quartz glass which experiences a reduction in OH group concentration of less than or equal to 100 ppm upon heat treatment at 900° C. for 100 hours as suitable material for the EUV lithography member.

9 Claims, 4 Drawing Sheets

(51) Int. Cl.
  *B82Y 10/00* (2011.01)
  *B82Y 40/00* (2011.01)
  *C03C 3/06* (2006.01)
  *G03F 1/24* (2012.01)
(52) U.S. Cl.
  CPC ...... *C03B 2201/42* (2013.01); *C03B 2207/06* (2013.01); *C03B 2207/12* (2013.01); *C03B 2207/36* (2013.01); *C03C 2201/06* (2013.01)

(56) References Cited

U.S. PATENT DOCUMENTS

| | | | |
|---|---|---|---|
| 7,410,922 B2 | 8/2008 | Iwahashi et al. | |
| 7,462,574 B2 | 12/2008 | Iwahashi et al. | |
| 7,923,394 B2 | 4/2011 | Maida et al. | |
| 7,935,648 B2 | 5/2011 | Maida et al. | |
| 2003/0138587 A1* | 7/2003 | Otsuka | C03B 19/1423 428/64.1 |
| 2005/0132749 A1* | 6/2005 | Otsuka et al. | 65/17.4 |
| 2005/0245382 A1* | 11/2005 | Iwahashi et al. | 501/54 |
| 2006/0081004 A1 | 4/2006 | Ishikawa et al. | |
| 2006/0137398 A1* | 6/2006 | Bleaking | C03B 19/1453 65/17.3 |
| 2007/0134566 A1 | 6/2007 | Maida et al. | |
| 2007/0272685 A1* | 11/2007 | Schreiber et al. | 220/2.1 R |
| 2008/0274869 A1 | 11/2008 | Englisch et al. | |
| 2008/0305940 A1 | 12/2008 | Maida et al. | |
| 2008/0305941 A1 | 12/2008 | Maida et al. | |
| 2009/0288448 A1 | 11/2009 | Maida et al. | |
| 2010/0091215 A1 | 4/2010 | Fukunaga et al. | |
| 2010/0142189 A1 | 6/2010 | Hong et al. | |
| 2011/0203318 A1 | 8/2011 | Otsuka et al. | |
| 2011/0301015 A1* | 12/2011 | Mitsumori | C03B 19/1423 501/53 |

FOREIGN PATENT DOCUMENTS

| | | |
|---|---|---|
| JP | 7-267662 A | 10/1995 |
| JP | 2004-315351 A | 11/2004 |
| JP | 2005-022954 A | 1/2005 |
| JP | 2005-187319 A | 7/2005 |
| JP | 2007-182367 A | 7/2007 |
| JP | 2008-505827 A | 2/2008 |
| JP | 2008-303100 A | 12/2008 |
| JP | 2009-13048 A | 1/2009 |
| WO | 2004-089839 A1 | 10/2004 |
| WO | 2005/114328 A2 | 12/2005 |
| WO | 2009-107847 A1 | 9/2009 |
| WO | 2009-107858 A1 | 9/2009 |

OTHER PUBLICATIONS

Japanese Office Action dated Nov. 12, 2013, issued in corresponding Japanese Patent Application No. 2009-294557 (3 pages).

Japanese Office Action dated Jan. 6, 2015, issued in corresponding JP Patent Application No. 2013-251151 (2 pages).

Agarwal, Anand et al "A Simple IR spectroscopic method for determining fictive temperature of silica glasses," Journal of Non-Crystalline Solids, Received May 19, 1994, vol. 185, pp. 191-198.

Khotimchenko, V.S. et al "Determining the content of hydrogen dissolved in quartz glass using the methods of raman scattering and mass spectrometry," Zhurnal Prikladnoi Spektroskopii, Jun. 1987, vol. 46 No. 6, pp. 987-991.

European Search Report dated Apr. 5, 2012, issued in corresponding European Patent Application No. 10252133.3 (5 pages).

\* cited by examiner

TITANIA-DOPED QUARTZ GLASS AND MAKING METHOD

CROSS-REFERENCE TO RELATED APPLICATION

This application is a divisional of U.S. application Ser. No. 12/967,175, filed on Dec. 14, 2010 which is a non-provisional application claims priority under 35 U.S.C. §119(a) on Patent Application No. 2009-294557 filed in Japan on Dec. 25, 2009, the entire contents of which are hereby incorporated by reference.

TECHNICAL FIELD

This invention relates to titania-doped quartz glass with low thermal expansion which is suited for use in the EUV lithography, and a method for manufacturing the same.

BACKGROUND ART

In the advanced lithography process for the fabrication of semiconductor devices, a light source of shorter wavelength is used for exposure. A subsequent transition to lithography using extreme ultraviolet (EUV) is regarded promising. Since the EUV lithography uses a reflecting optical system and a short wavelength light source, the lithography accuracy can be adversely affected even by a slight thermal expansion of each member (e.g., substrate) in the lithographic optical system induced by the heat that has reached there. Accordingly, members like reflecting mirrors, masks, and stages must be made of low expansion materials. Titania-doped quartz glass is known as a typical low expansion material. The addition of a certain amount of titania makes it possible to minimize the thermal expansion of quartz glass.

The EUV lithography members must also have a uniform distribution of low thermal expansion. To gain a uniform distribution of low thermal expansion, it is of the first priority that titania-doped quartz glass have a uniform content of titania. For example, JP-A 2004-315351 discloses titania-doped quartz glass in which a difference between maximum and minimum $TiO_2$ concentrations is less than or equal to 0.06% by weight in a range of 30 mm×30 mm, and a variation ($\Delta n$) of refractive index which varies with the $TiO_2$ concentration in quartz glass is less than or equal to $2\times10^{-4}$ in a range of 30 mm×30 mm.

Also an OH group concentration in titania-doped quartz glass is known as one of the physical properties having impact on the low thermal expansion of titania-doped quartz glass. WO 2005/114328 discloses a quartz glass blank having a mean OH content of 700 to 1,000 wt ppm, wherein the variation of the OH content, averaged over the thickness of the quartz glass blank, is within ±50 ppm in the area of the main functional direction. Then the optical and thermal properties of quartz glass are kept as homogeneous as possible.

JP-A 2005-022954 describes that the fictive temperature of glass is correlated to the extent of a zero expansion temperature range that is a temperature range in which the coefficient of thermal expansion (CTE) of glass becomes substantially zero (0). For the purpose of broadening the zero expansion temperature range, the fictive temperature is preferably up to 950° C., more preferably up to 900° C., and even more preferably up to 850° C. Since a high OH group concentration in glass indicates fast structural relaxation, the manufacture of a glass block having a large diameter enough to have a temperature distribution tends to entail a fictive temperature distribution. Thus the OH group concentration is preferably up to 600 ppm, more preferably up to 400 ppm, and even more preferably up to 200 ppm. In addition, if the OH group concentration varies over a wide range, the structural relaxation time may substantially vary at different positions, inviting a difference in fictive temperature. Thus the variation of the OH group concentration in titania-doped quartz glass is preferably within 50 ppm, more preferably within 30 ppm, and even more preferably within 10 ppm.

As discussed above, the OH group concentration in titania-doped quartz glass has an outstanding impact on low thermal expansion. It is thus important to specify the absolute amount and distribution of the OH group concentration in titania-doped quartz glass. It would be desirable to minimize the variation of the OH group concentration.

CITATION LIST

Patent Document 1: JP-A 2004-315351
Patent Document 2: WO 2005/114328 (JP-A 2008-505827)
Patent Document 3: JP-A 2005-022954
Patent Document 4: JP-A H07-267662

DISCLOSURE OF INVENTION

It would be desirable to have a titania-doped quartz glass which experiences a little or substantially no change of its OH group concentration upon heat treatment at 900° C. for 100 hours and is suited as members for use in the EUV lithography and a method for preparing the same.

The inventors made a study on the heat treatment of titania-doped quartz glass. Sometimes glass changed its OH group concentration upon heat treatment at 900° C. for 100 hours. Such glass with a noticeable change of OH group concentration is unsuited as EUV lithography members. Titania-doped quartz glass which experiences a little or substantially no change of its OH group concentration upon heat treatment at 900° C. for 100 hours is suited as EUV lithography members.

It is known in the art that the concentration of OH groups in quartz glass can be reduced by heat treating a porous silica matrix, which is prepared by the indirect or soot method, for example, under high-temperature vacuum conditions or in a chlorine-containing atmosphere. The OH group concentration may be changed as long as quartz glass has not been converted into transparent glass.

However, it is known that the OH group concentration in quartz glass which has been converted into transparent glass may not be substantially changed in absolute amount and distribution by any simple heat treatment but special heat treatments such as hydrothermal treatment, homogenization treatment described in JP-A H07-267662, and heat treatment at high temperature and high pressure in a hydrogen-containing atmosphere. Specifically, the absolute amount and distribution of OH group concentration in quartz glass are decided depending on a particular preparation method and parameters during preparation including gas feed rates, temperature distribution of the growth front, and atmosphere.

The behavior of titania-doped quartz glass is different. The absolute amount and distribution of OH group concentration in titania-doped quartz glass depend on a particular preparation method and parameters during preparation as in the case of quartz glass. The OH group concentration in titania-doped quartz glass which has been converted into transparent glass may be changed by simple heat treatment. Even though the variation of OH group concentration in titania-doped quartz glass is reduced as described in the above-referred patent document, this glass will change the OH group concentration when heated, resulting in a varying OH group concentration.

Under the circumstances, the inventors sought for titania-doped quartz glass which, after vitrification, experiences a little or substantially no change of OH group concentration upon simple heat treatment. When titania-doped quartz glass is prepared by subjecting a silicon-providing reactant gas and a titanium-providing reactant gas to oxidation or flame hydrolysis with the aid of a combustible gas and a combustion-supporting gas, to thereby synthesize synthetic silica-titania fine particles, depositing the silica-titania fine particles on a rotating target, and concurrently melting and vitrifying the deposited particles into titania-doped quartz glass, an improvement is made by feeding oxygen gas as the combustion-supporting gas through a central tube of a burner in admixture with the silicon-providing reactant gas and the titanium-providing reactant gas in a molar ratio of oxygen gas to the sum of the silicon-providing reactant gas and the titanium-providing reactant gas of at least 5, and preferably further injecting hydrogen gas as the combustible gas through one or more hydrogen gas feed tubes of the burner at a linear velocity of less than or equal to 100 m/sec. The resulting titania-doped quartz glass experiences a reduction in OH group concentration of less than or equal to 100 ppm upon heat treatment at 900° C. for 100 hours. Preferably the difference between maximum and minimum reductions of OH group concentration is less than or equal to 50 ppm. There is obtained a titania-doped quartz glass whose OH group concentration shows no substantial change upon simple heat treatment and a minimal variation. The invention is predicated on these findings.

An object of the present invention is to provide a titania-doped quartz glass which experiences a little or substantially no change of OH group concentration upon heat treatment at 900° C. for 100 hours, and a method for preparing the same.

In one aspect, the invention provides a titania-doped quartz glass which experiences a reduction in OH group concentration of less than or equal to 100 ppm upon heat treatment at 900° C. for 100 hours.

In a preferred embodiment, the difference between maximum and minimum reductions of OH group concentration upon the 900° C./100-hr heat treatment is less than or equal to 50 ppm. In a preferred embodiment, the titania-doped quartz glass has an OH group concentration of 300 ppm to 950 ppm after the 900° C./100-hr heat treatment, an OH group concentration gradient of less than or equal to 100 ppm/cm after the 900° C./100-hr heat treatment, or a hydrogen molecule concentration of less than or equal to $5 \times 10^{17}$ molecules/cm$^3$, or a combination of any of the foregoing. Typically the titania-doped quartz glass contains 3 to 10% by weight of titania.

In another aspect, the invention provides an EUV lithographic member comprising the titania-doped quartz glass defined above.

The member is typically a EUV lithographic photomask substrate or a mirror in a reflecting optical system of a EUV lithography apparatus.

In a further aspect, the invention provides a method for preparing a titania-doped quartz glass, comprising the steps of subjecting a silicon-providing reactant gas and a titanium-providing reactant gas to oxidation or flame hydrolysis with the aid of a combustible gas and a combustion-supporting gas, to thereby form synthetic silica-titania fine particles, depositing the silica-titania fine particles on a rotating target, and concurrently melting and vitrifying the deposited particles into titania-doped quartz glass. In one embodiment, the method further comprises the step of feeding oxygen gas as the combustion-supporting gas through a central tube of a burner in admixture with the silicon-providing reactant gas and the titanium-providing reactant gas in a molar ratio of oxygen gas to the sum of the silicon-providing reactant gas and the titanium-providing reactant gas of at least 5. In another embodiment, the method further comprises the step of injecting hydrogen gas as the combustible gas through one or more hydrogen gas feed tubes of a burner at a linear velocity of less than or equal to 100 m/sec.

In a preferred embodiment, the flow rates of the combustible gas, the combustion-supporting gas, the silicon-providing reactant gas and the titanium-providing reactant gas are controlled so that respective variations of the flow rates may fall within ±1%, the temperatures of cooling air introducing from the outside of a quartz glass manufacturing furnace thereinto, exhaust gas from the furnace, and ambient air surrounding the furnace are controlled so that respective variations of the temperatures may fall within ±2.5° C., and the target is rotated at a rotational speed of at least 5 rpm when the silica-titania fine particles are deposited on the rotating target.

ADVANTAGEOUS EFFECTS OF INVENTION

Since titania-doped quartz glass experiences only a minimal change of OH group concentration upon heat treatment at 900° C. for 100 hours, it is suited to construct a member for use in the EUV lithography.

DESCRIPTION OF EMBODIMENTS

Figure 1:
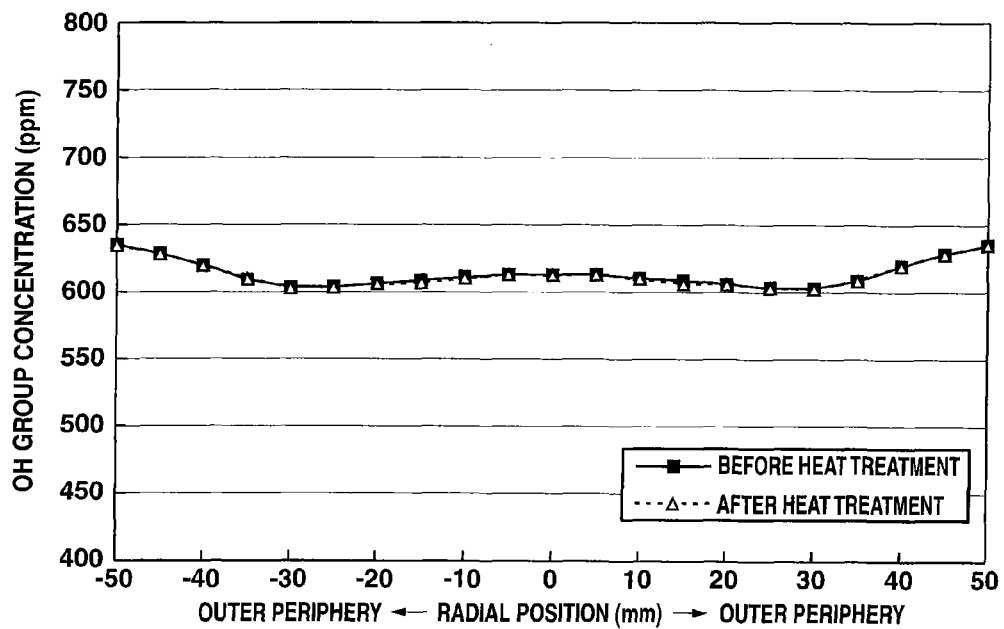
FIG. 1 is a diagram showing an OH group concentration distribution in titania-doped quartz glass in Example 1 before and after 900° C./100-hr heat treatment.

Unlike undoped quartz glass, titania-doped quartz glass may change its OH group concentration upon heat treatment at 900° C. for 100 hours (simply referred to as "900° C./100-hr heat treatment," hereinafter). A substantial change of the OH group concentration upon 900° C./100-hr heat treatment broadens the OH group concentration distribution in titania-doped quartz glass and at the same time, has impact on both the fictive temperature and birefringence. As a result, thermal properties of titania-doped quartz glass are altered. Also, when titania-doped quartz glass experiencing a substantial change of the OH group concentration upon 900° C./100-hr heat treatment is used as a member in the EUV lithography, it is likely to display thermal hysteregy due to thermal cycling, that is, repeated rise and fall of the member temperature during EUV light exposure and interruption of exposure. Therefore, titania-doped quartz glass experiencing a OH group concentration change in excess of 100 ppm is inadequate as the EUV lithography member.

When titania-doped quartz glass experiences a substantial change of the OH group concentration upon 900° C./100-hr heat treatment, crystalline silica often forms in the titania-doped quartz glass as a result of the heat treatment. It is believed that once fine titania grains form within the ingot during preparation of titania-doped quartz glass, crystalline silica grows on the titania grains serving as nuclei during the heat treatment. Formation of titania grains as inclusions in the titania-doped quartz glass and crystalline silica is inadequate as the EUV lithography member which is required to have a high accuracy, cleanness, and stable thermal properties at its surface.

In contrast, titania-doped quartz glass of the invention experiences a minimal change of the OH group concentration upon 900° C./100-hr heat treatment and is adequate as the EUV lithography member.

According to the invention, such titania-doped quartz glass may be prepared by feeding a combustible gas containing hydrogen and a combustion-supporting gas containing oxygen to a burner built in a quartz glass-manufacturing furnace, burning the gases to form an oxyhydrogen flame at the burner tip, feeding a silicon-providing reactant gas and a titanium-providing reactant gas into the flame for subjecting the gases to oxidation or flame hydrolysis to thereby form silica, titania and composite fine particles, depositing the fine particles on a rotating target disposed forward of the burner, and concurrently melting and vitrifying the deposited particles into titania-doped quartz glass to form an ingot, shaping the ingot into a predetermined shape, and annealing the shaped ingot. In a preferred embodiment, the flow rates of the combustible gas, the combustion-supporting gas, the silicon-providing reactant gas and the titanium-providing reactant gas are controlled so that respective variations of the flow rates may fall within ±1%, the temperatures of cooling air introducing from the outside of the furnace thereinto, exhaust gas from the furnace, and ambient air surrounding the furnace are controlled so that respective variations of the temperatures may fall within ±2.5° C., and the target is rotated at a rotational speed of at least 5 rpm when the silica-titania fine particles are deposited on the rotating target.

The quartz glass-manufacturing furnace may be of vertical or horizontal type. The target of a seed or similar material is rotated at a rotational speed of at least 5 rpm, preferably at least 15 rpm, and more preferably at least 30 rpm. This is because striae, strains or structurally or compositionally non-uniform zones generate, depending largely on the unevenness of temperature in a portion where titania-doped quartz glass grows on the rotating target. Then the generation of structurally or compositionally non-uniform zones in titania-doped quartz glass can be inhibited by increasing the rotational speed of the target so that an even temperature may be available in a portion where titania-doped quartz glass grows. The upper limit of rotational speed of the target may be selected as appropriate although it is usually up to 300 rpm, specifically up to 200 rpm. Control of the rotational speed of the target is important in reducing the gradient of the OH group concentration of titania-doped quartz glass.

The generation of structurally or compositionally non-uniform zones in titania-doped quartz glass can be inhibited by supplying the silicon-providing reactant gas, titanium-providing reactant gas, combustible gas, and combustion-supporting gas at steady rates. To this end, in one preferred embodiment, the flow rates of the silicon-providing reactant gas, titanium-providing reactant gas, combustible gas, and combustion-supporting gas are each controlled within a variation of ±1%, more preferably ±0.5%, and even more preferably ±0.25%.

The generation of structurally or compositionally non-uniform zones in titania-doped quartz glass can also be inhibited by supplying the silicon-providing reactant gas and the titanium-providing reactant gas into a common nozzle of the burner along with the combustion-supporting gas during the preparation of titania-doped quartz glass. The silicon-providing reactant gas, the titanium-providing reactant gas and the combustion-supporting gas are previously mixed to form a premix, which is preferably made uniform in composition by a line mixer or the like.

Specifically, the silicon-providing reactant gas and the titanium-providing reactant gas are fed through a central tube of a burner, and oxygen gas as the combustion-supporting gas is fed through the central tube in admixture with the silicon-providing reactant gas and the titanium-providing reactant gas. In the mixture, oxygen gas is present in a molar ratio of oxygen gas to the sum of the silicon-providing reactant gas and the titanium-providing reactant gas of at least 5, more preferably at least 7.5, and even more preferably at least 10. If a molar ratio of oxygen gas as the combustion-supporting gas to the sum of the silicon-providing reactant gas and the titanium-providing reactant gas is less than 5, the titania-doped quartz glass prepared under such conditions tends to experience a substantial reduction of the OH group concentration upon 900° C./100-hr heat treatment. The upper limit of the molar ratio is usually up to 30, and preferably up to 20.

In another preferred embodiment, hydrogen gas as the combustible gas is injected through one or more hydrogen gas feed tubes of the burner at a linear velocity of less than or equal to 100 m/sec, more preferably less than or equal to 90 m/sec, and even more preferably less than or equal to 80 m/sec for each tube. If the linear velocity of hydrogen gas injected as the combustible gas through the burner is higher than 100 m/sec, the titania-doped quartz glass prepared under such conditions tends to experience a substantial reduction of the OH group concentration upon 900° C./100-hr heat treatment. The lower limit of the linear velocity is usually at least 10 m/sec, and preferably at least 20 m/sec. Control of the molar ratio of oxygen gas to the sum of the silicon-providing reactant gas and the titanium-providing reactant gas and the linear velocity of hydrogen gas is important in reducing the reduction-on-heating of the OH group concentration of titania-doped quartz glass.

Figure 2:
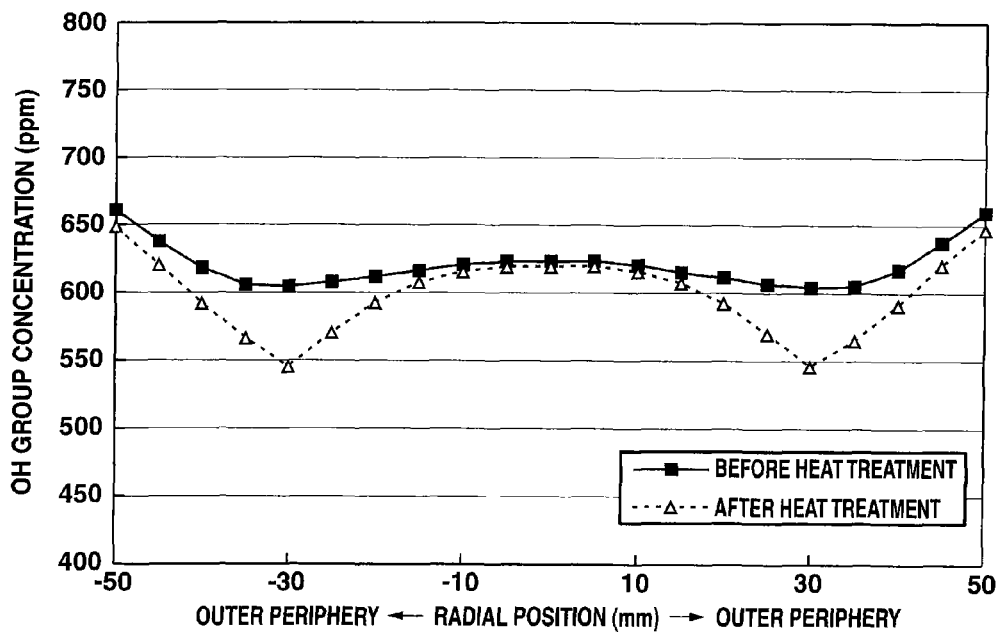
FIG. 2 is a diagram showing an OH group concentration distribution in titania-doped quartz glass in Example 2 before and after 900° C./100-hr heat treatment.
Figure 7:
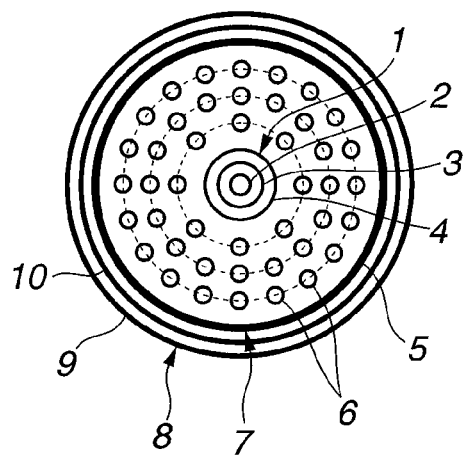
FIG. 7 is a radial cross-sectional view of a gas injection outlet of a burner for the manufacture of synthetic quartz glass used in Examples.
Figure 8:
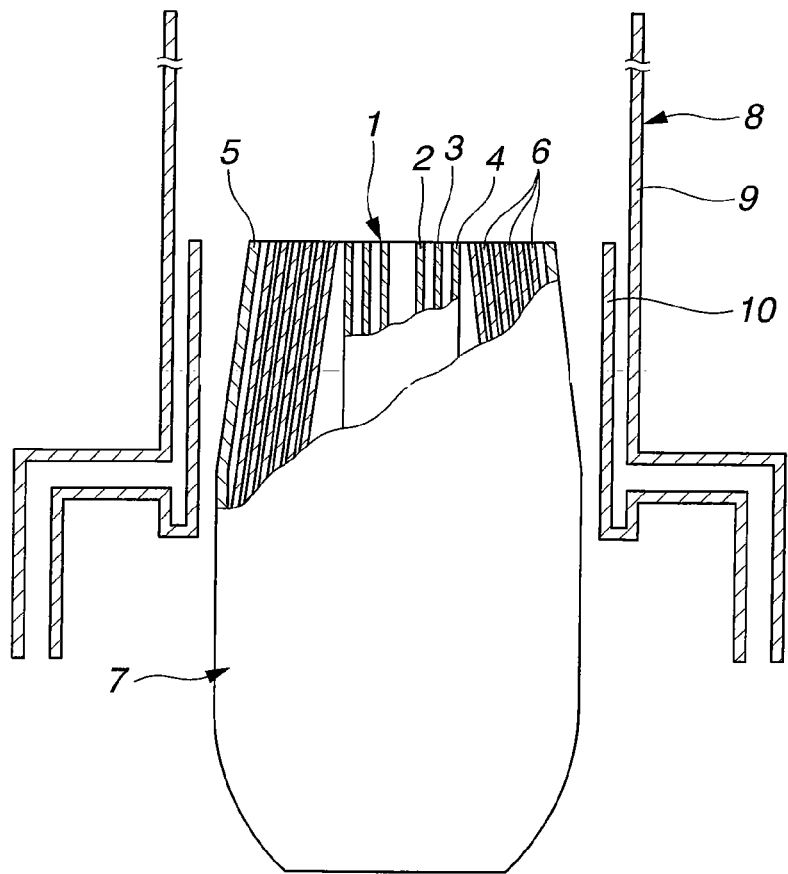
FIG. 8 is a side view, partially in axial cross section, of the burner of FIG. 7.

The burner used herein may be the one illustrated in FIGS. 1 and 2 of JP-A 2005-187319, but is not limited thereto. The burner comprises a main burner including a multi-fold tube of at least triple-tube structure, a shell tube surrounding the multi-fold tube, and a plurality of nozzles inside the shell tube. The burner further comprises a dual tube disposed outside the main burner. Referring to FIGS. 7 and 8, a main burner 7 includes a multi-tube assembly 1 of triple-tube structure consisting of a central tube 2, a first enclosure tube 3 enclosing the central tube 2, and a second enclosure tube 4 enclosing the first enclosure tube 3. The main burner 7 also includes a shell tube 5 surrounding the triple-tube assembly 1, and a plurality of nozzles 6 which are disposed inside the shell tube 5 and distributed between the shell tube 5 and the triple-tube assembly 1. A dual tube 8 consisting of an outer tube 9 and an inner tube 10 disposed inside the outer tube 9 is disposed outside the main burner 7 and surrounds at least the front opening of the main burner 7. The dual tube 8 is configured such that a tip portion of the outer tube 9 surrounds the front opening of the main burner 7 and axially extends forward thereof to provide a guard for preventing the gas stream from the main burner 7 from spreading laterally. A tip portion of the inner tube 10 is radially coextensive with the front opening of the main burner 7. It is noted that the tip portion of the inner tube 10 may be disposed backward of the front opening of the main burner 7

With the tube arrangement illustrated above, the silicon-providing reactant gas and the titanium-providing reactant gas are fed and flowed through the central tube 2, and oxygen gas is also fed and flowed through the central tube 2. The combustion-supporting gas such as oxygen gas is fed and flowed through the first enclosure tube 3. The combustible gas such as hydrogen gas is fed and flowed through the second enclosure tube 4. Further, the combustion-supporting gas such as oxygen gas is fed and flowed through the nozzles 6 and the dual tube 8 (between outer and inner tubes 9 and 10). The combustible gas such as hydrogen gas is fed and flowed through the shell tube 5 so that the gas flows around the nozzles 6.

The oxygen gas prescribed as being fed in a molar ratio of at least 5 relative to the sum of silicon-providing reactant gas and titanium-providing reactant gas is an oxygen gas fraction through the central tube 2. The silicon-providing reactant gas is preferably fed at a flow rate of 500 to 3,000 g/hr, more preferably 1,000 to 2,000 g/hr, and the titanium-providing reactant gas is preferably fed at a flow rate of 85 to 500 g/hr, more preferably 150 to 350 g/hr. A weight ratio of the titanium-providing reactant gas to the silicon-providing reactant gas is preferably between 0.8 and 0.15, more preferably between 0.11 and 0.13 so that titania-doped quartz glass may contain 3 to 10% by weight, specifically 5 to 8% by weight of titania.

While the proportion of oxygen gas in the gas flow through the central tube 2 is as defined above, the flow rates of oxygen gas through tubes other than the central tube 2 may be determined so as to total 0.8 to 1.1 times the stoichiometry for reaction with hydrogen gas.

Control of gas flow rates is important in minimizing the difference between maximum and minimum reductions of OH group concentration in titania-doped quartz glass and reducing the hydrogen molecule concentration in titania-doped quartz glass. Control of titania content is important in enabling preparation at the temperature at which the CTE of titania-doped quartz glass becomes zero.

While the second enclosure tube 4 and the shell tube 5 serve as hydrogen gas feed tubes, hydrogen gas flows through each of the enclosure tube and shell tube at a linear velocity of up to 100 m/sec. When hydrogen gas is fed through more than two tubes, a linear velocity of hydrogen gas through a respective one of the tubes is up to 100 m/sec.

The silicon-providing reactant gas used herein may be selected from well-known organosilicon compounds, for example, silicon tetrachloride, chlorosilanes such as dimethyldichlorosilane and methyltrichlorosilane, and alkoxysilanes such as tetramethoxysilane, tetraethoxysilane, and methyltrimethoxysilane.

The titanium-providing reactant gas used herein may also be selected from well-known compounds, for example, titanium halides such as titanium tetrachloride and titanium tetrabromide, and titanium alkoxides such as tetraethoxytitanium, tetraisopropoxytitanium, tetra-n-propoxytitanium, tetra-n-butoxytitanium, tetra-sec-butoxytitanium, and tetra-t-butoxytitanium.

On the other hand, the combustible gas used herein may be one containing hydrogen, optionally in combination with another gas such as carbon monoxide, methane or propane. The combustion-supporting gas used herein may be one containing oxygen.

As described above, titania-doped quartz glass is prepared by feeding a combustible gas containing hydrogen and a combustion-supporting gas containing oxygen to a burner built in a quartz glass-manufacturing furnace, burning the gases to form an oxyhydrogen flame at the burner tip, feeding a silicon-providing reactant gas and a titanium-providing reactant gas into the flam to subject the gases to oxidation or flame hydrolysis to thereby form silica, titania and composite fine particles, depositing the fine particles on a rotating target disposed forward of the burner, and concurrently melting and vitrifying the deposited particles into titania-doped quartz glass to form an ingot. A sample is cut out of the titania-doped quartz glass ingot and measured for OH group concentration. The sample is then heat treated at 900° C. for 100 hours, after which it is measured again for OH group concentration. A reduction of OH group concentration is computed.

In order that the titania-doped quartz glass ingot be shaped into a desired shape suited for a particular EUV lithography member such as a mirror, stage or photomask substrate, it is first shaped at a temperature of 1,500 to 1,800° C. for 1 to 10 hours. Preferably shaping is conducted such that the axis of the shape is parallel to the growth axis of the titania-doped quartz glass grown in the manufacture furnace. After the shaping, the titania-doped quartz glass is annealed. The annealing step is effective for mitigating any thermal strain induced in the titania-doped quartz glass by shaping. Annealing may be conducted under well-known conditions, for example, by holding at a temperature of 700 to 1,300° C. in air for 1 to 200 hours. This may be followed by slow cooling, for example, at a rate of 1 to 20° C./hr from the annealing temperature to 500° C. The annealing treatment may reduce the fictive temperature of titania-doped quartz glass. Preferably the titania-doped quartz glass has a fictive temperature of lower than or equal to 1,200° C., more preferably lower than or equal to 1,150° C., and even more preferably lower than or equal to 1,100° C. Since the CTE of titania-doped quartz glass depends on the distribution of fictive temperature, it preferably has a fictive temperature distribution ($\Delta$FT) of lower than or equal to 30° C., more preferably lower than or equal to 20° C., and even more preferably lower than or equal to 10° C. It is noted that the fictive temperature of titania-doped quartz glass may be measured by the method described in J. Non-Cryst. Solids, 185, 191 (1995).

After the annealing treatment, the titania-doped quartz glass is worked into a predetermined size by machining or slicing and then polished by a double-side lapping machine with an abrasive such as silicon oxide, aluminum oxide, molybdenum oxide, silicon carbide, diamond, cerium oxide or colloidal silica, thereby forming an EUV lithography member. From the titania-doped quartz glass, EUV lithography photomask substrates can be formed in which the difference between the highest and the lowest positions (also referred to as peak-to-valley (P-V) flatness) within a central region of 142.4 mm×142.4 mm square in the substrate surface as polished is up to 200 nm, preferably up to 100 nm. It is noted that the P-V flatness may be determined by a Fizeau interferometer (Zygo Mark IV).

By the method described above, titania-doped quartz glass is obtainable which experiences a little change of OH group concentration upon heating. Specifically the titania-doped quartz glass of the invention experiences a reduction in OH group concentration of less than or equal to 100 ppm upon heat treatment at 900° C. for 100 hours. The reduction of OH group concentration is more preferably less than or equal to 50 ppm, and even more preferably less than or equal to 20 ppm. Most preferably the reduction of OH group concentration is substantially nil, that is, within the measurement error range before and after the 900° C./100-hr heat treatment.

In a preferred embodiment of titania-doped quartz glass, the difference between maximum and minimum reductions of OH group concentration upon the 900° C./100-hr heat treatment is less than or equal to 50 ppm, more preferably less than or equal to 20 ppm, and most preferably substantially nil. If a substantial difference is found in the reduction of OH group concentration upon the 900° C./100-hr heat treatment, the glass has a distribution of thermal properties and is inadequate as the EUV lithography member.

The titania-doped quartz glass should preferably have an OH group concentration of from 300 ppm to 950 ppm, more preferably from 400 ppm to 850 ppm, even more preferably more than 500 ppm and less than 750 ppm, and most preferably more than 500 ppm and less than 700 ppm, after the 900° C./100-hr heat treatment. If the OH group concentration is less than 300 ppm, titania-doped quartz glass is often colored. Such colored glass is undesired because it inhibits transmission of laser light used in the alignment of a member in the EUV lithography. If the OH group concentration is more than 950 ppm, titania-doped quartz glass tends to generate unwanted inclusions such as bubbles when shaped into the desired shape.

The titania-doped quartz glass should preferably have an OH group concentration gradient of less than or equal to 100 ppm/cm, more preferably less than or equal to 50 ppm/cm, and even more preferably less than or equal to 20 ppm/cm, after the 900° C./100-hr heat treatment. If the OH group concentration gradient is greater than the range after the 900° C./100-hr heat treatment, titania-doped quartz glass even featuring a little reduction of OH group concentration upon the 900° C./100-hr heat treatment has a distribution of thermal properties and is inadequate as the EUV lithography member.

An OH group concentration of titania-doped quartz glass is measured by an infrared spectrophotometer FT/IR-300E by Jasco Corp. Specifically, a glass sample was scanned over a range of 3,000 to 5,000 $cm^{-1}$ at a resolution of 2 $cm^{-1}$ and an accumulation count of 20, obtaining an absorption spectrum. A straight line connecting peaks at 4,762 $cm^{-1}$ and 4,202 $cm^{-1}$ is used as the baseline. An absorption coefficient is given as the peak height near 4,522 $cm^{-1}$. The OH group concentration is computed in accordance with the equation:

OH group concentration (ppm)=(absorption coefficient at 4522 $cm^{-1}$)/$T$×4400 wherein T is a thickness (cm) of a sample.

In a test, measurement was repeated 5 times at the same position on the glass sample, with a measurement value being an average of 5 measured values. A measurement value of OH group concentration varied in a range of ±2 ppm at the same measurement position. When measurement values at the same position of the same sample were in a range of ±2 ppm before and after the 900° C./100-hr heat treatment, the difference between maximum and minimum reductions of OH group concentration was regarded substantially nil. Measurement of OH group concentration was made at intervals of 5 mm from the center to the outer periphery of a sample.

It is noted that the 900° C./100-hr heat treatment is preferably carried out in a neutral or oxidizing atmosphere, for example, in air, oxygen, nitrogen or an inert gas such as argon. The internal pressure of the heat treatment furnace may be an added pressure, atmospheric (1 atm) or reduced pressure although atmospheric or reduced pressure is preferred from the standpoints of installation and safety.

The titania-doped quartz glass should preferably have a hydrogen molecule concentration of less than or equal to $5\times10^{17}$ molecules/$cm^3$, more preferably less than or equal to $1\times10^{17}$ molecules/$cm^3$. Even more preferably, in Raman spectroscopy, the peak near 4,135 $cm^{-1}$ assigned to hydrogen molecule is below the detection limit. Since titania-doped quartz glass containing more hydrogen molecules tends to generate unwanted inclusions such as bubbles when shaped into the desired shape, it is preferred that the concentration of hydrogen molecules be as low as possible.

It is noted that the hydrogen molecule concentration is measured by a Raman spectrometer NRS-2100 by Jasco Corp. using a 4-W argon ion laser as the exciting light source and according to the method described in Zurnal Pril; adnoi Spektroskopii Vol. 46, No. 6, pp 987-991, June 1987. The detection limit is $7.5\times10^{16}$ molecules/$cm^3$.

The titania-doped quartz glass should preferably has a titania content of 3 to 10% by weight, more preferably 5 to 8% by weight in order that the glass undergo low thermal expansion in the exposure temperature range of the EUV lithography. The titania content is measured by electron probe microanalysis (EPMA) using a probe with a diameter of 10 μm. Computation is made on the assumption that all titanium detected is present as titania ($TiO_2$).

In a preferred embodiment, the titania-doped quartz glass has a coefficient of thermal expansion (CTE) which becomes zero (0) at a temperature within the temperature range of 0° C. to 100° C., more preferably within the temperature range of 10° C. to 90° C., even more preferably within the temperature range of 20° C. to 80° C., further preferably within the temperature range of 30° C. to 70° C., even further preferably within the temperature range of 40° C. to 60° C., and most preferably within the temperature range of 45° C. to 55° C. It is noted that the CTE and the thermal expansion curve may be determined on a sample sized 6 mm diameter and 12 mm length and having cannonball shaped ends by a thermal dilatometer LIX-2 by Ulvac-Riko, Inc.

The titania-doped quartz glass is suited as a stock for forming EUV lithography members such as EUV lithography photomask substrates and reflecting optical system mirrors in EUV lithography apparatus. It is best suited as EUV lithography photomask substrates and reflecting optical system mirrors in EUV lithography apparatus since it enables transfer of a pattern of high image quality and fine size onto a wafer.

EXAMPLE

Examples and Comparative Examples are given below for illustrating the invention although the invention is not limited thereto.

Examples 1 to 3

A titania-doped quartz glass ingot was prepared by using a furnace including a quartz burner as shown in FIGS. 7 and 8, feeding gases (SiCl$_4$, TiCl$_4$, O$_2$, H$_2$) to respective tubes of the burner as shown in Table 1, forming an oxyhydrogen flame, effecting oxidation or flame hydrolysis of silicon tetrachloride and titanium tetrachloride in the oxyhydrogen flame to produce SiO$_2$ and TiO$_2$, depositing silica and titania fine particles on a target, and concurrently melting and vitrifying the particles. The target was disposed forward of the burner, rotated at 50 rpm, and retracted at 10 mm/hr. Oxygen gas was fed in admixture with the silicon-providing reactant gas and titanium-providing reactant gas through the central tube, and hydrogen gas was fed through the second enclosure tube and shell tube. Table 3 reports a molar ratio of oxygen gas to the sum of silicon-providing reactant gas and titanium-providing reactant gas and the linear velocity of hydrogen gas flows. The flow rates of respective gases were kept at a variation of ±0.2%. During preparation of titania-doped quartz glass in the furnace, the temperatures of inlet air to the furnace, exhaust gas from the furnace, and ambient air around the furnace were kept at a variation of ±1° C.

Figure 3:
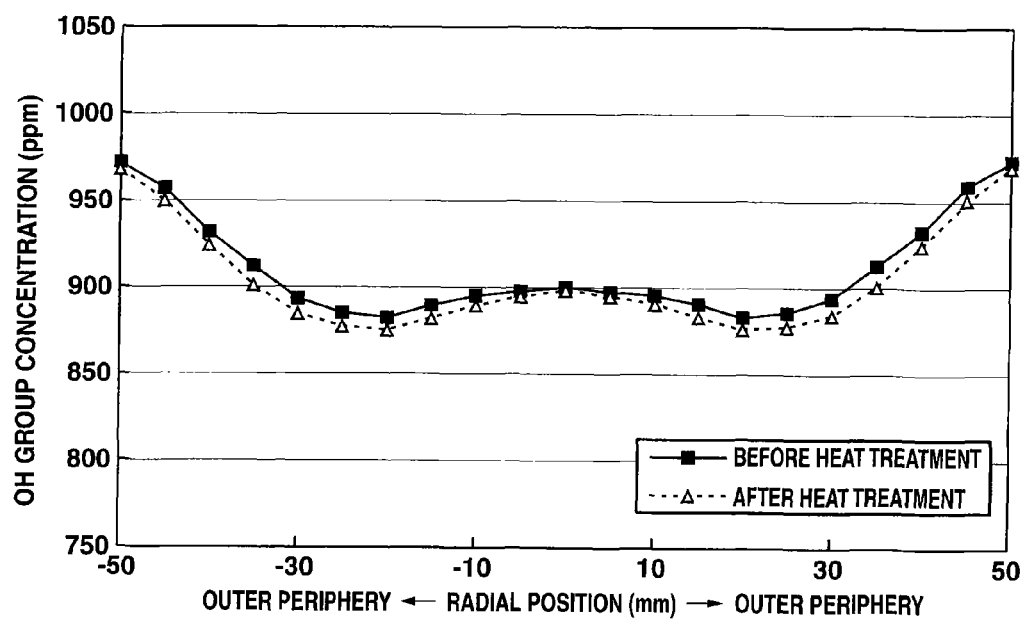
FIG. 3 is a diagram showing an OH group concentration distribution in titania-doped quartz glass in Example 3 before and after 900° C./100-hr heat treatment.

The resulting ingot had a diameter of 110 mm and a length of 400 mm. A disk sample of 10 mm thick was sliced from the ingot, ground and polished on both the surfaces, after which a OH group concentration was measured in a radial direction. The sample was further heat treated for 100 hours in air at 900° C. and atmospheric pressure, after which a OH group concentration was measured again in a radial direction. Also a hydrogen molecule concentration was measured by Raman spectroscopy and a TiO$_2$ concentration by EPMA. Table 4 reports maximum and minimum reductions of OH group concentration by the 900° C./100-hr heat treatment, the difference between the maximum and minimum reductions of OH group concentration, maximum gradient of OH group concentration by the 900° C./100-hr heat treatment, hydrogen molecule concentration, and maximum and minimum of TiO$_2$ concentration. FIGS. 1 to 3 show a radial distribution of the OH group concentration before and after the 900° C./100-hr heat treatment in Examples 1 to 3, respectively.

The remaining titania-doped quartz glass ingot was shaped by heating at 1700° C. for 6 hours. It is noted that only the ingot of Example 3 was cylindrically ground to a depth of 10 mm from the periphery prior to shaping. The ingot was annealed by holding in air at 950° C. for 150 hours and then slowly cooling at a rate of 5° C./hr to 500° C. The annealed ingot was machined into a square column of 152.4 mm by 152.4 mm, designated titania-doped quartz glass ingot I. A substrate was sliced from ingot I. The substrate was polished for 6 hours by a double-side lapping machine Model 12B (Fujikoshi Machinery Corp.) using a suede-type polishing pad and cerium oxide abrasive and then for 1 hour using colloidal silica abrasive instead. This resulted in a substrate of 1 mm thick having both surfaces mirror polished. The polished substrate was measured for fictive temperature along a diagonal, with maximum and minimum values thereof being reported in Table 4.

A sample for a thermal expansion test was cut out of the remaining ingot I from the center within the 152.4 mm×152.4 mm square. A thermal expansion curve was determined in a temperature range of −50° C. to 150° C. The temperature at which the CTE becomes zero on the thermal expansion curve, referred to as "zero expansion temperature", is reported in Table 4.

Further, a substrate of 6.7 mm thick was sliced from the remaining ingot I. The substrate was polished for 6 hours by a double-side lapping machine Model 12B (Fujikoshi Machinery Corp.) using a suede-type polishing pad and cerium oxide abrasive and then for 1 hour using colloidal silica abrasive instead. The polished substrate had a thickness of 6.35 mm. For the substrate thus obtained, a difference between the highest and lowest positions in a central region of 142.4 mm×142.4 mm square in the substrate surface was measured using a laser interferometer. The result is reported in Table 4 as P-V flatness in exposure-accessible region.

The titania-doped quartz glass obtained in Example 1 experienced a OH group concentration change within the measurement error range upon 900° C./100-hr heat treatment. That is, a reduction of the OH group concentration is substantially nil while the OH group concentration is at an adequate level. Neither coloration nor inclusion was observed, the OH group concentration gradient was low, and the fictive temperature distribution was restricted. The glass is best suited as EUV lithography members.

The titania-doped quartz glass obtained in Example 2 included a region experiencing a relatively large reduction of the OH group concentration. As a result, the OH group concentration gradient and the fictive temperature distribution were relatively noticeable.

The titania-doped quartz glass obtained in Example 3 included an outer peripheral portion having a high OH group concentration and containing bubbles. However, a reduction of the OH group concentration was small. Given that the bubbled region is machined off, the glass is suited as EUV lithography members.

Example 4

Figure 4:
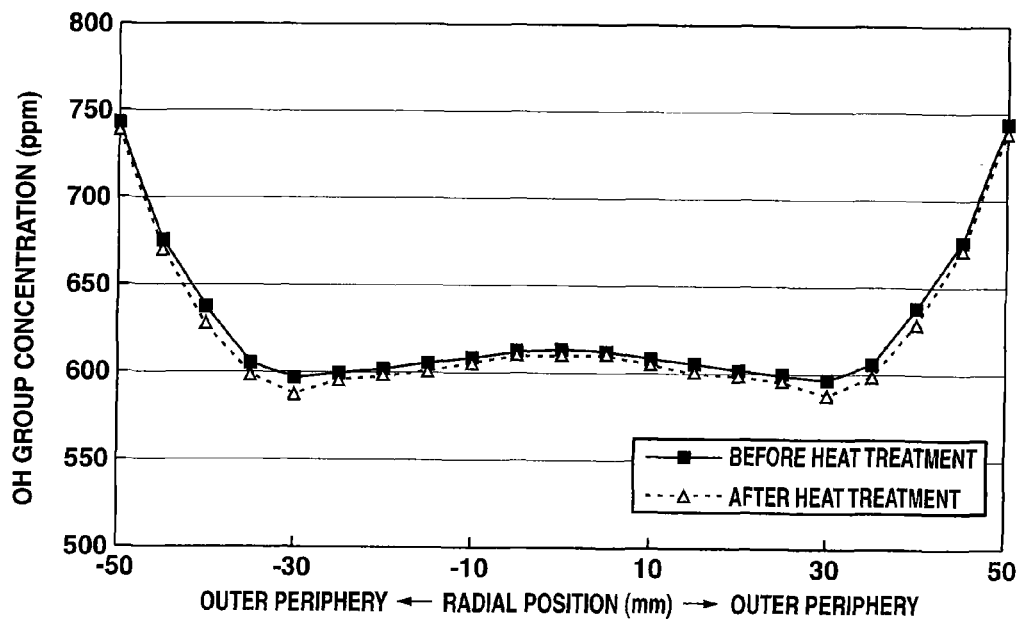
FIG. 4 is a diagram showing an OH group concentration distribution in titania-doped quartz glass in Example 4 before and after 900° C./100-hr heat treatment.

A titania-doped quartz glass ingot was prepared by the same procedure as in Example 1 except that the target was rotated at 5 rpm. The ingot was measured for properties as in Example 1, with the results shown in Table 4. FIG. 4 shows a radial distribution of the OH group concentration before and after the heat treatment (air/900° C./atmospheric pressure/100 hours).

The titania-doped quartz glass obtained in Example 4 showed an increased OH group concentration gradient because the OH group concentration abruptly increased in an outer peripheral portion. However, a reduction of the OH group concentration was small. Thus, the glass was suited as EUV lithography members.

Comparative Examples 1 and 2

Figure 5:
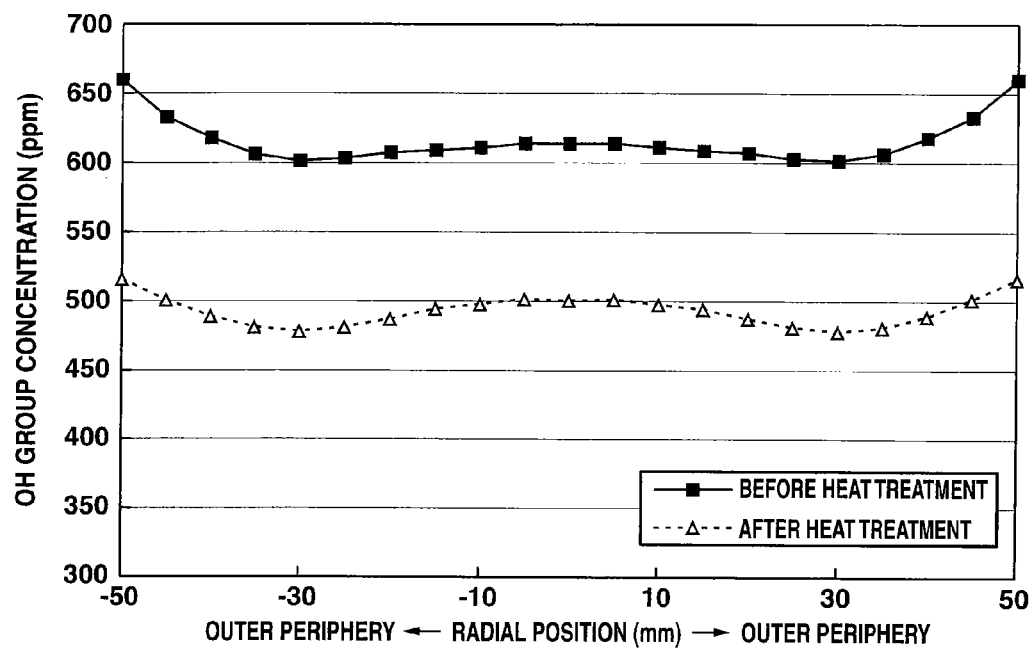
FIG. 5 is a diagram showing an OH group concentration distribution in titania-doped quartz glass in Comparative Example 1 before and after 900° C./100-hr heat treatment.
Figure 6:
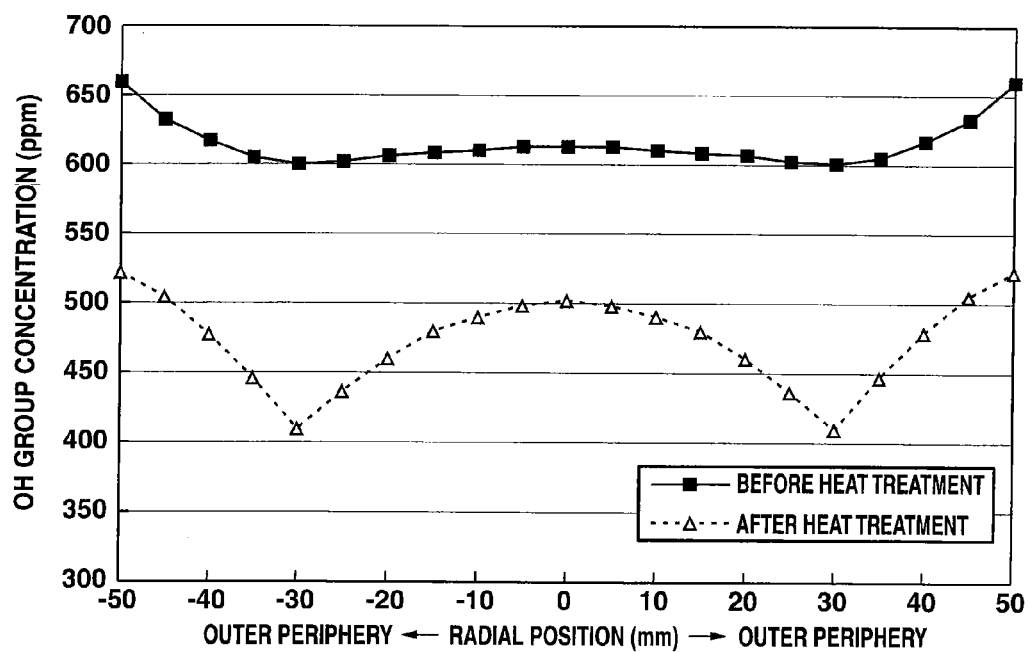
FIG. 6 is a diagram showing an OH group concentration distribution in titania-doped quartz glass in Comparative Example 2 before and after 900° C./100-hr heat treatment.

Titania-doped quartz glass ingots were prepared by the same procedure as in Example 1 except that the gas feed conditions shown in Table 2 were used. The ingots were measured for properties as in Example 1, with the results shown in Table 4. FIGS. 5 and 6 show a radial distribution of the OH group concentration before and after the heat treatment (air/900° C./atmospheric pressure/100 hours) in Comparative Examples 1 and 2, respectively.

The titania-doped quartz glass obtained in Comparative Example 1 had an adequate OH group concentration, but showed a substantial reduction of OH group concentration in the overall ingot.

The titania-doped quartz glass obtained in Comparative Example 2 showed a substantial reduction of OH group concentration, with the reduction having a broad distribution. In a region showing a substantial reduction of OH group concentration, crystalline silica was observed after shaping.

TABLE 1

|  | Gas | Example 1, 4 | | Example 2 | | Example 3 | |
|---|---|---|---|---|---|---|---|
|  |  | Cross-sectional area (mm$^2$) | Gas flow rate (Nm$^3$/hr) | Cross-sectional area (mm$^2$) | Gas flow rate (Nm$^3$/hr) | Cross-sectional area (mm$^2$) | Gas flow rate (Nm$^3$/hr) |
| Central tube | SiCl$_4$ | 15 | 1,420 g/hr | 15 | 1,420 g/hr | 15 | 1,420 g/hr |
|  | TiCl$_4$ |  | 200 g/hr |  | 200 g/hr |  | 200 g/hr |
|  | O$_2$ |  | 2.46 |  | 2.46 |  | 2.46 |
| 1st enclosure tube | O$_2$ | 30 | 1 | 30 | 1 | 30 | 1 |
| 2nd enclosure tube | H$_2$ | 50 | 14 | 50 | 17 | 50 | 14 |
| Shell tube | H$_2$ | 1,700 | 25 | 1,700 | 24 | 1,700 | 32 |
| Nozzles | O$_2$ | 150 | 13 | 150 | 13 | 150 | 17 |
| Dual tube | O$_2$ | 1,090 | 3 | 1,090 | 3 | 1,090 | 3 |

TABLE 2

|  | Gas | Comparative Example 1 | | Comparative Example 2 | |
|---|---|---|---|---|---|
|  |  | Cross-sectional area (mm$^2$) | Gas flow rate (Nm$^3$/hr) | Cross-sectional area (mm$^2$) | Gas flow rate (Nm$^3$/hr) |
| Central tube | SiCl$_4$ | 15 | 1,420 g/hr | 15 | 1,420 g/hr |
|  | TiCl$_4$ |  | 200 g/hr |  | 200 g/hr |
|  | O$_2$ |  | 0.92 |  | 0.92 |
| 1st enclosure tube | O$_2$ | 30 | 1 | 30 | 1 |
| 2nd enclosure tube | H$_2$ | 50 | 14 | 50 | 24 |
| Shell tube | H$_2$ | 1,700 | 25 | 1,700 | 24 |
| Nozzles | O$_2$ | 150 | 11 | 150 | 13 |
| Dual tube | O$_2$ | 1,090 | 2 | 1,090 | 3 |

TABLE 3

|  | Example | | | Comparative Example | |
|---|---|---|---|---|---|
|  | 1, 4 | 2 | 3 | 1 | 2 |
| Molar ratio of O$_2$ gas to reactant gases | 11.6 | 11.6 | 11.6 | 4.4 | 4.4 |
| Linear velocity of H$_2$ gas in 2nd enclosure tube (m/sec) | 77.78 | 94.44 | 77.78 | 77.78 | 133.33 |
| Linear velocity of H$_2$ gas in shell tube (m/sec) | 4.08 | 3.92 | 5.23 | 4.08 | 3.92 |

TABLE 4

|  |  | Example | | | | Comparative Example | |
|---|---|---|---|---|---|---|---|
|  |  | 1 | 2 | 3 | 4 | 1 | 2 |
| Reduction of OH group concentration (ppm) | Maximum | ≤2 | 59 | 11 | 9 | 144 | 190 |
|  | Minimum | ≤2 | 3 | ≤2 | 2 | 112 | 111 |
|  | (Max − Min) | ≤2 | 56 | ≤11 | 7 | 32 | 79 |
| OH group concentration (ppm) | Maximum | 634 | 648 | 969 | 738 | 515 | 522 |
|  | Minimum | 602 | 545 | 875 | 587 | 477 | 410 |
| Gradient of OH group concentration (ppm/cm) |  | 19 | 56 | 49 | 110 | 27 | 68 |
| Hydrogen molecule concentration (molecules × 10$^{17}$/cm$^3$) |  | N.D. | N.D. | 4 | N.D. | N.D. | N.D. |
| Fictive temperature (° C.) | Maximum | 872 | 888 | 853 | 865 | 902 | 898 |
|  | Minimum | 860 | 843 | 825 | 814 | 880 | 861 |
|  | (Max − Min) | 12 | 45 | 28 | 51 | 22 | 37 |
| TiO$_2$ concentration (wt %) | Maximum | 7.1 | 7.1 | 7.1 | 7.1 | 7.1 | 7.1 |
|  | Minimum | 6.9 | 6.9 | 6.9 | 6.9 | 6.9 | 6.9 |
| Zero expansion temperature (° C.) |  | 43 | 45 | 41 | 38 | 25 | 32 |
| P-V flatness (nm) |  | 58 | 62 | 84 | 73 | 92 | 81 |

Note:
N.D. stands for not detected.

Japanese Patent Application No. 2009-294557 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of selecting a titania-doped quartz glass having a reduction in OH group concentration of less than or equal to 100 ppm, comprising
measuring a sample taken from a titania-doped quartz glass ingot to be selected for OH group concentration,
heat-treating the sample of the titania-doped quartz glass ingot at 900° C. for 100 hours,
measuring the heat-treated sample for OH group concentration,
computing a reduction of OH group concentration to evaluate the sample whether the reduction of OH group concentration is less than or equal to 100 ppm or not
selecting the titania-dope quartz glass ingot whose sample had a reduction of OH group concentration less than or equal to 100 ppm and then shaping the selected ingot into a predetermined shape,
wherein said titania-doped quartz glass ingot being prepared by a method comprising the steps of
subjecting a silicon-providing reactant gas and a titanium-providing reactant gas to oxidation or flame hydrolysis with the aid of a combustible gas and a combustion-supporting gas, to thereby form synthetic silica titania fine particles,
depositing the silica-titania fine particles on a rotating target, and concurrently melting and vitrifying the deposited particles into titania-doped quartz glass.

2. The method of claim 1 wherein the titania-doped quartz glass to be selected further has a difference between maximum and minimum reductions of OH group concentration upon the 900° C./100-hour heat treatment of less than or equal to 50 ppm.

3. The method of claim 1 wherein the titania-doped quartz glass to be selected further has an OH group concentration of 300 ppm to 950 ppm after the 900° C./100-hour heat treatment.

4. The method of claim 1 wherein the titania-doped quartz glass to be selected further has an OH group concentration gradient of less than or equal to 100 ppm/cm after the 900° C./100-hour heat treatment.

5. The method of claim 1 wherein the method of preparing the titania-doped quartz glass ingot further comprises a step of feeding oxygen gas as the combustion supporting gas through a central tube of a burner in admixture with the silicon-providing reactant gas and the titanium-providing reactant gas in a molar ratio of oxygen gas to the sum of the silicon-providing reactant gas and the titanium-providing reactant gas of at least 5, and/or a step of injecting hydrogen gas as the combustible gas through one or more hydrogen gas feed tubes of the burner at a linear velocity of less than or equal to 100 m/sec.

6. The method of claim 5, wherein the molar ratio of oxygen gas to a sum of the silicon-providing reactant gas and the titanium-providing reactant gas is no more than 30.

7. The method of claim 5, wherein the molar ratio of oxygen gas to a sum of the silicon-providing reactant gas and the titanium-providing reactant gas is at least 10.

8. The method of claim 5, wherein the molar ratio of oxygen gas to a sum of the silicon-providing reactant gas and the titanium-providing reactant gas is no more than 20.

9. The method of claim 1 wherein in the method of preparing the titania-doped quartz glass ingot, flow rates of the combustible gas, the combustion-supporting gas, the silicon-providing reactant gas and the titanium-providing reactant gas are controlled so that respective variations of the flow rates may fall within ±1%, temperatures of cooling air introduced into a quartz glass manufacturing furnace from outside, exhaust gas from the furnace, and ambient air surrounding the furnace are controlled so that respective variations of the temperatures may fall within ±2.5° C., and the rotating target is rotated at a rotational speed of at least 5 rpm when the silica-titania fine particles are deposited on the rotating target.

* * * * *